(12) United States Patent
Sato et al.

(10) Patent No.: US 6,424,176 B2
(45) Date of Patent: Jul. 23, 2002

(54) LOGIC CIRCUITS USED FOR ADDRESS DECODING

(75) Inventors: Fumihiko Sato; Hiroyuki Takahashi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/789,136

(22) Filed: Feb. 20, 2001

(30) Foreign Application Priority Data

Feb. 23, 2000 (JP) ........................................ 2000-045425

(51) Int. Cl.[7] ................... H03K 19/094; H03K 19/096
(52) U.S. Cl. ................... 326/83; 326/93; 326/95; 326/112; 326/119; 326/121; 327/333
(58) Field of Search ................... 326/93–98, 104–106, 326/108, 112, 119, 121, 62, 63, 68; 327/333

(56) References Cited

U.S. PATENT DOCUMENTS

| | | | | |
|---|---|---|---|---|
| 4,011,549 A | * | 3/1977 | Bormann | 340/173 |
| 4,300,213 A | * | 11/1981 | Tanimura et al. | 365/190 |
| 6,297,686 B1 | * | 10/2001 | Lin et al. | 327/534 |

* cited by examiner

Primary Examiner—Michael Tokar
Assistant Examiner—Vibol Tan
(74) Attorney, Agent, or Firm—Darryl G. Walker

(57) ABSTRACT

A logic circuit (200) having a critical path input signal (C2) that can have a reduced input capacitance and a logic output (D2) that can have a reduced voltage swing is disclosed. According to one embodiment, the logic circuit may include an input circuit (210), a driver circuit (220), and a load circuit (230). Driver circuit (220) can include stacked transistors (N4 and N5) of the same conductivity type, which can generate a logic output (D2) that can have a reduced voltage swing. Driver circuit (220) can generate a feedback signal that can control the impedance of a load circuit (230). Load circuit (230) can be actively controlled to improve the response of a logic evaluation node (V2).

20 Claims, 6 Drawing Sheets

LOGIC CIRCUITS USED FOR ADDRESS DECODING

TECHNICAL FIELD

The present invention relates generally logic circuits, and more particularly to logic circuits used for address decoding.

BACKGROUND OF THE INVENTION

Semiconductor devices, such as semiconductor memories, use address decoders to selectively activate a memory cell based on an external address or an internally generated address. During read, write, refresh (DRAM) and erase (EPROM) cycles, decoders can be activated. These decoders will typically be directly in the critical speed path of the device.

An example of a conventional logic circuit, that may be used as a decoder, is set forth in FIG. 13 and is designated by the general reference character 1300. Conventional logic circuit 1300 contains an input circuit 1310 and a driver circuit 1320. Input circuit 1310 is a conventional Complementary Metal Oxide Semiconductor (CMOS) 3-input NAND gate containing three n-channel Metal Oxide Semiconductor Field Effect Transistors (MOSFETs) (N12–N14) connected in series between ground (GND) and a logic evaluation node V13. The input circuit also contains three p-channel MOSFETS (P6–P8) connected in parallel between a high power supply (VCC) and logic evaluation node V13. The MOSFETS (N12–N14 and P6–P8) are configured so that each n-channel MOSFET (N12–N14) and each p-channel MOSFET (P6–P8) receives a single input (A13–C13). If all the inputs (A13–C13) are at a logic high level, then conventional logic circuit 1300 is in a selected state and logic evaluation node V13 is pulled to GND, which corresponds to a low logic level, through n-channel MOSFETs (N12–N14). If any of the inputs (A13–C13) are at a logic low level then at least one of the n-channel MOSFETs (N12–N14) will be turned off and at least one of the p-channel MOSFETs (P6–P8) will be turned on. Thus, logic evaluation node V13 will be pulled to a high logic level VCC, which corresponds to an unselected state.

It is noted that each input is received at the gate of one n-channel MOSFET (N12–N14) and one p-channel MOSFET (P6–P8). This causes an input (A13–C13) to be loaded by a relatively large gate capacitance. Considering that inputs (A13–C13) are typically addresses and are connected to a large number of such logic circuits 1300, waveforms of the inputs (A13–C13) can rise and fall slowly, and/or be rounded at the corners. This can cause reduced circuit operation speeds and also can cause extended time periods of flow through current in which current flows through the input circuit 1310 directly from VCC to GND.

Driver circuit 1320 is connected to receive the logic level at logic evaluation node V13 and produces a logic output D13. Driver circuit 1320 is two inverters (INV11 and INV12) connected in series. The inverters (INV11 and INV12) are CMOS inverters, thus each contain an n-channel MOSFET and p-channel MOSFET. Inverter INV12 uses relatively large MOSFETs in order to drive a highly capacitive signal line connected to logic output D13. Because inverter INV12 is a CMOS inverter, the logic output D13 is driven from rail to rail (VDD to GND and vice-versa). This can cause unwanted power consumption due to the charging and discharging of the highly capacitive signal line connected to logic output D13.

A p-channel MOSFET will typically source less current than an n-channel MOSFET of the same size due to the lower mobility of the majority carriers or "holes." Thus, it may take a longer time for logic output D13 to achieve a trip-point or threshold of the receiving circuit (not shown) when going from logic low to logic high.

Also, the use of a p-channel MOSFET and an n-channel MOSFET in the inverter INV12 can cause circuit layout inefficiencies because there is a minimum device isolation distance required from an MOSFET and the edge of the well or tank. Because an n-channel and a p-channel MOSFET device is being used, both p-well and n-well regions can be required, this can require two such minimum device isolation distances, thus creating a larger layout area.

Another example of a conventional logic circuit, that may be used as a decoder, is set forth in FIG. 14 and is designated by the general reference character 1400. Conventional logic circuit 1400 contains an input circuit 1410, a driver circuit 1420 and a load circuit 1430. The input circuit 1410 has three n-channel MOSFETs (N15–N17) that are configured in the same manner as the three n-channel MOSFETs (N12–N14) in the input circuit 1310 of FIG. 13. Driver circuit 1420 of FIG. 14 is configured in the same manner as driver circuit 1320 of FIG. 13. Conventional logic circuit 1400 of FIG. 14 also has a load circuit 1430. The load circuit 1430 has a p-channel MOSFET P9 having a source connected to VCC, a drain connected to logic evaluation node V14 and a gate connected to GND.

In a selected state, conventional logic circuit 1400 receives inputs A14–C14 which all are logic high. Thus, all three series connected n-channel MOSFETs (N15–N17) are turned on. The n-channel MOSFETs (N15–N17) are sized to have a series resistance that is significantly less than the resistance of p-channel MOSFET P9 when the n-channel MOSFETs (N15–N17) are turned on. Therefore, when all inputs (A14–C14) are at a logic high, logic evaluation node V14 is pulled low enough to be seen as a logic low, which is then output by driver circuit 1420 at logic output D14.

When any of the inputs (A14–C14) have a logic low level, at least one of the n-channel MOSFETs (N15–N17) is turned off, thus logic evaluation node V14 is pulled high through p-channel MOSFET P9.

Conventional logic circuit 1400 of FIG. 14 has a smaller input capacitance than the logic circuit 1300 of FIG. 13. However, due to the need keep the ratio between the impedance of p-channel MOSFET P9 and the impedance of series n-channel MOSFETs (N15–N17) low, p-channel MOSFET P9 will typically be a relatively weak device. Thus, the pull-up speed of logic evaluation node V14 is slow, which can adversely delay the rising edge of logic output D14. Conversely, if the p-channel MOSFET P9 is made stronger, then the pull-down speed of logic evaluation node V14 can become slow.

Conventional logic circuit 1400 of FIG. 14 can also have the same current consumption and trip-point problems due to the rail-to-rail output of inverter INV14 as conventional logic circuit 1300 of FIG. 13.

Another example of a conventional logic circuit, that may be used as a decoder, is set forth in FIG. 15 and is designated by the general reference character 1500. The conventional logic circuit 1500 contains an input circuit 1510, a driver circuit 1520 and a load circuit 1530. In conventional logic circuit 1500, driver circuit 1520 and load circuit 1530 are constructed and operate generally in the same manner as driver circuit 1420 and load circuit 1430 in conventional logic circuit 1400 of FIG. 14.

Input circuit 1510 contains two n-channel MOSFETs (N18 and N19) connected in series between logic determination node V15 and input C15. N-channel MOSFETs (N18 and N19) receive inputs A15 and B15, respectively, at their gates.

In a selected state, conventional logic circuit 1500 receives inputs A15 and B15, which are logic high, and input C15 which is at a logic low. Thus, both series connected n-channel MOSFETs (N18 and N19) are turned on and pass the logic low level of input C15 to logic evaluation node V15. N-channel MOSFETs (N18 and N19) are sized to have a series resistance that is significantly less than the resistance of p-channel MOSFET P10 when n-channel MOSFETs (N18 and N19) are turned on. Therefore, when in a selected state, logic evaluation node V15 is pulled low enough to be seen as a logic low which is then output by driver circuit 1520 at logic output D15.

In a worst case select to deselect transition, one of inputs (A15 or B15) changes to logic low level, at least one of the n-channel MOSFETs (N18 and N19) is turned off, thus logic evaluation node V15 is pulled high through p-channel MOSFET P10.

The logic circuit 1500 of FIG. 15 has a smaller input capacitance than the logic input circuit 1300 of FIG. 13. However, due to the need keep the ratio between the impedance of p-channel MOSFET P10 and the impedance of series n-channel MOSFETs (N18 and N19) low, p-channel MOSFET P10 will typically be a relatively weak device. Thus, the pull-up speed of logic evaluation node V15 can be slow, which can adversely delay the rising edge of logic output D15. Conversely, if the p-channel MOSFET P10 is made stronger, then the pull-down speed of logic evaluation node V15 can become slow.

The conventional logic circuit 1500 of FIG. 15 can also have the same current consumption and trip-point problems due to the rail-to-rail output of inverter INV16 as the conventional logic circuit 1300 of FIG. 13.

In view of the above discussion, it would be desirable to provide a logic circuit that can have an improved propagation delay over conventional approaches. It would also be desirable to reduce current consumption in driving capacitive output signal lines.

SUMMARY OF THE INVENTION

According to the present embodiments, logic circuit includes an input circuit, an output circuit and a load circuit. The input circuit can receive logic inputs and generate a logic evaluation signal at a logic evaluation node. The output circuit can receive the logic evaluation signal and produce a logic output having a voltage swing that is less than a rail-to-rail swing. The output circuit can generate a feedback signal that can control the impedance of the load circuit. The load circuit can be coupled to the logic evaluation node and act as an active load of variable impedance.

According to one aspect of the embodiments, the logic input can include IGFETs of the same conductivity type connected in series and having gates that can receive logic input signals. Another logic input signal can be provided as a source input to one of the IGFETs.

According to another aspect of the embodiments, the output circuit can include two IGFETs of the same conductivity type acting as pull-up and pull-down drivers for the logic output. The logic output can have a voltage swing less than the rail-to-rail voltage of the high and low power supply voltages.

According to another aspect of the embodiments, the output circuit can include inverters coupled to receive the voltage at the logic evaluation node and produce control signals for the gates of the pull-up and pull-down drivers.

According to another aspect of the embodiments, the output circuit produces a feedback signal to control the impedance of the load circuit. The feedback signal can be the logic output.

According to another aspect of the embodiments, the feedback signal controlling the impedance of the load circuit can be generated from an inverter or inverters that are coupled to receive the logic evaluation node as an input.

According to another aspect of the embodiments, the output circuit can produce a logic output that is of the same polarity as the logic evaluation node.

According to another aspect of the embodiments, the output circuit can produce a logic output that is a logical inversion of the logic evaluation node.

According to another aspect of the embodiments, the load circuit can include an IGFET having a controllable impedance path coupled between a power supply and the logic evaluation node.

According to another aspect of the embodiments, the impedance path of the load circuit can be controlled by a feedback signal having a voltage swing less than a rail-to-rail voltage of the high and low power supplies.

According to another aspect of the embodiments, the load circuit can include a transistor acting as a voltage limiter to the feedback signal controlling the impedance path of an IGFET acting as an active load.

According to another aspect of the embodiments, the load circuit can include an inverter, acting as a voltage limiter to the feedback signal controlling the impedance path of an IGFET acting as an active load.

According to another aspect of the embodiments, logic circuits can be used in a multi-stage decoding scheme in which decoded signals can have a reduced voltage swing.

According to another aspect of the embodiments, logic circuits can have a critical path coupled to a source drive input, such that the critical path can have a reduced capacitive load.

DETAILED DESCRIPTION OF THE EMBODIMENTS

Various embodiments of the present invention will now be described in detail with reference to a number of drawings.

Figure 2:
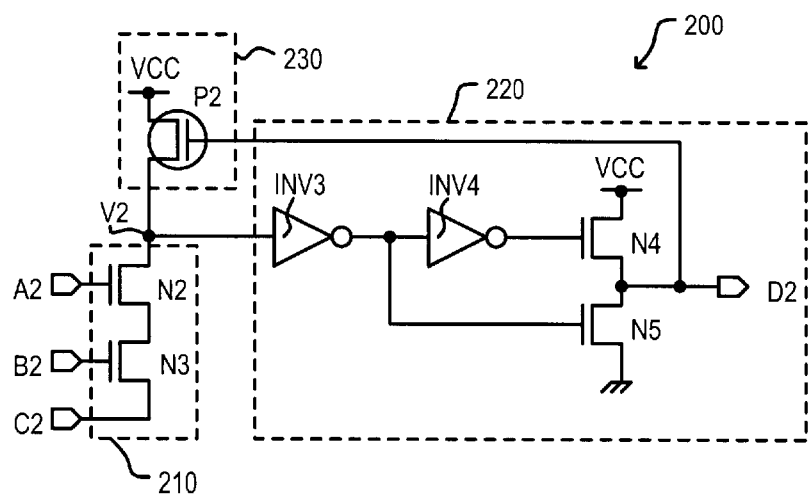
FIG. 2 is a circuit diagram of a logic circuit according to an embodiment.

Referring now to FIG. 2, a logic circuit according to an embodiment is set forth and given the general reference character 200. Logic circuit 200 may include an input circuit 210, a driver circuit 220, and a load circuit 230.

Input circuit 210 may include transistors (N2 and N3) connected in series between a logic evaluation node V2 and an input signal C2. Transistors (N2 and N3) may preferably be n-channel Insulated Gate Field Effect Transistors (IGFETs). Transistor N2 may have a drain coupled to logic evaluation node V2, a source coupled to the drain of transistor N3 and a gate coupled to receive an input signal A2. Transistor N3 may have a drain coupled to the source of transistor N2, a source coupled to receive an input signal C2 and a gate coupled to receive an input signal B2.

Driver circuit 220 may include inverters (INV3 and INV4) and transistors (N4 and N5). Inverter INV3 can have an input coupled to logic evaluation node V2 and an output coupled to the input of inverter INV4 and to the gate of transistor N5. Inverter INV4 can have an input coupled to the output of inverter INV3 and an output coupled to transistor N4. Transistors (N4 and N5) may preferably be n-channel IGFETs. Transistor N4 can have a drain coupled to a high power supply voltage VCC, a source coupled to a drain of transistor N5, and a gate coupled to the output of inverter INV4. Transistor N5 can have a drain coupled to a source of transistor N4, a source coupled to a low power supply voltage VSS, and a gate coupled to the output of inverter INV3. Transistors (N4 and N5) may have their source/drain coupled together to produce a logic output D2.

Load circuit 230 may include a transistor P2. Transistor P2 may preferably be a p-channel IGFET. Transistor P2 can have a source coupled to high power supply voltage VCC, a drain coupled to logic evaluation node V2 and a gate coupled to receive a feedback signal. In the logic circuit 200 of FIG. 2, the feedback signal may be logic output D2.

The operation of logic circuit 200 will now be described. In a selected state, inputs (A2, B2, and C2) can be logical high, high, and low, respectively. In a non-selected state, one of inputs (A2, B2, or C2) can be a logical low, low, or high, respectively. Of the three inputs (A2–C2), the source driving input (C2) to transistor N3 may be considered a critical speed path. Thus, when going from a non-selected state to a selected state, input C2 can be the last input to transition into its selected condition (logic low in this case). This can improve the operating speed of logic circuit 200, because input C2 is coupled to a source of transistor N3 while the other inputs (A2 and B2) are coupled to the gates of transistors (N2 and N3), respectively. Thus, input C2 may be coupled to a smaller capacitive load than inputs A2 and B2.

Switching logic circuit 200 from a non-selected state to a selected state can now be described.

In the non-selected state, logic output D2 can be at a voltage level of VCC−Vt, where Vt is a threshold voltage of n-channel IGFET N4. This voltage level can be fed back to the gate of transistor P2. Thus, p-channel IGFET P2 may not be completely turned off, but can be in a high impedance state. This can allow logic evaluation node V2 to be kept at a high voltage level and may not be considered floating. Thus, the logic high level can propagate through inverter INV3 to produce a logic low output which can keep transistor N5 in a non-conducting or off state. Inverter INV4 can produce a logic high output which can keep transistor N5 turned on, thus latching the voltage level of VCC−Vt (which can be considered a logic high) at logic output D2.

As logic circuit 200 prepares for a transition from a non-selected state to a selected state, inputs (A2 and B2) can each become logic high which can turn on (make conductive) transistors N2 and N3. A timing control circuit (not shown) can then set the timing of input C2 (the critical path), so that it can transition to a logic low. Thus, logic evaluation node V2 can be pulled down to a logic low level. Inverter INV3 can apply a logic high to the gate of transistor N5, which can turn transistor N5 on. Inverter INV4 can apply a logic low to the gate of transistor N4 which can turn transistor N4 off. With transistor N5 on and transistor N4 off, logic output D2 can be pulled down to VSS and can become a logic low level. This logic low level can be applied as a feedback signal to the gate of transistor P2, thus turning on transistor P2. Transistor P2 can be weaker than, and thus over driven by, transistors N2 and N3. Such an arrangement can allow evaluation node V2 to remain at a logic low level.

By pulling up on the logic evaluation node V2, transistor P2 can improve the speed in which logic circuit 200 transitions back to a non-selected state when inputs (A2, B2, and C2) indicate a non-selected condition. When one of the inputs (A2, B2, or C2) indicates a non-selected condition, transistor P2 can pull evaluation node V2 to a high logic level, which can cause logic output D2 to be latched at a voltage of VCC−Vt.

Figure 1:
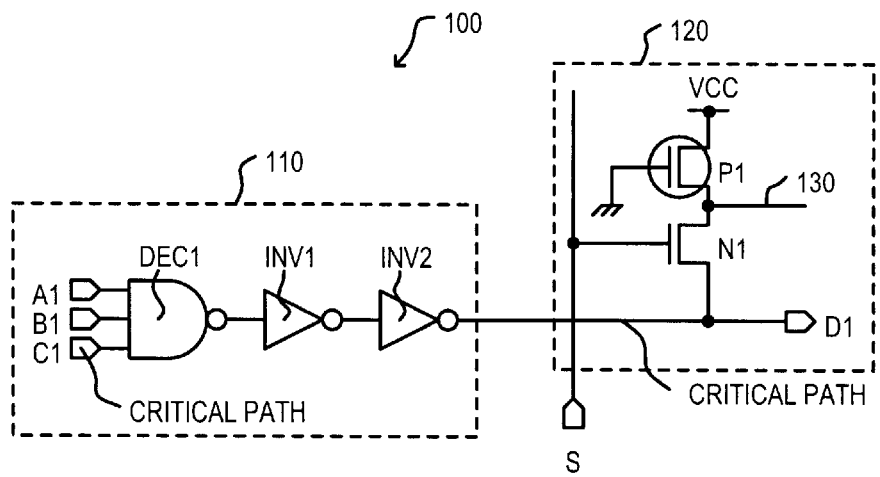
FIG. 1 is a circuit diagram of a decoder circuit according to an embodiment.

Referring now to FIG. 1, a decoder circuit is set forth and given the general reference character 100. Decoder circuit 100 can be used to illustrate an application for logic circuit 200 in a word line decoding scheme of a semiconductor memory device. Decoder circuit 100 can include a main word decoder section 110 and a sub-word decoder section 120. Main word decoder section can receive word addresses or factors (pre-decoded addresses) A1, B1, and C1 and can generate a main word line D1. Main word line D1 can be received by sub-word decoder section 120. Sub-word decoder section 120 can generate a sub-word line 130. Conceptually, main word decoder section 110 can be located at the edge of a memory array (not shown). Main word line D1 can be a conductor routed over the memory array. The memory array can be divided into a plurality of memory sub-arrays. Each memory sub-array can include a sub-word decoder section 120 which can receive main word line D1. Sub-word decoder section 120 can select a sub-word line 130 based on a selected main word line D1 and a sub-array select signal S. Because main word line D1 can be routed over a memory array and coupled to a plurality of sub-word decoder sections 120, main word line D1 can have a relatively large capacitance. Charging and discharging main word line D1 can consume significant power.

Main word decoder section 110 can include a decoder DEC1, which can be drawn functionally as a 3-input NAND gate. Main word decoder section 110 can also include two inverters (INV1 and INV2), which can be coupled in series receiving the output of decoder DEC1 and can produce a main word line D1 output.

Sub-word decoder section 120 can include transistor N1 and transistor P1. Transistor N1 can be a n-channel IGFET.

Transistor N1 can have a source coupled to main word line D1, a drain coupled to sub-word line 130, and a gate coupled to receive sub-array select signal S. Transistor P1 can be a p-channel IGFET. Transistor P1 can have a source coupled to VCC, a drain coupled to sub-word line 130, and a gate coupled to VSS.

Logic circuit 200 of FIG. 2 can be applied to main word decoder section 110 of FIG. 1. In a non-selected state, main word line D1 can be at a VCC−Vt voltage. When main word decoder 110 enters a selected state, main word line D1 can be pulled to a logic low potential or VSS. Thus, it can be seen that relatively highly capacitive main word line D1 can have a reduced voltage swing of VCC−Vt to VSS. It is noted that when entering the selected state when applying logic circuit 200 of FIG. 2 to main word decoder section 110 of FIG. 1, input C2 can be the last input to transition into a selected condition (logic low in this case). Thus, input C1 of FIG. 1 can be viewed as a critical path.

Figure 13:
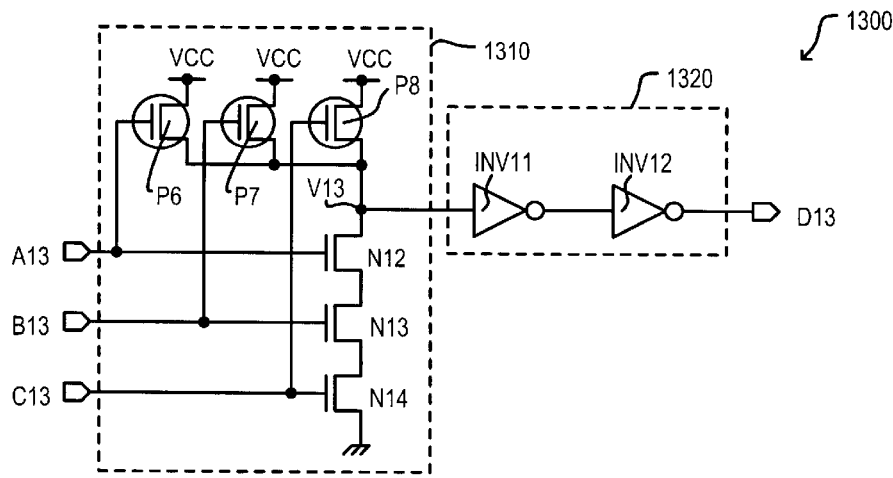
FIG. 13 is a circuit diagram of a conventional logic circuit.
Figure 14:
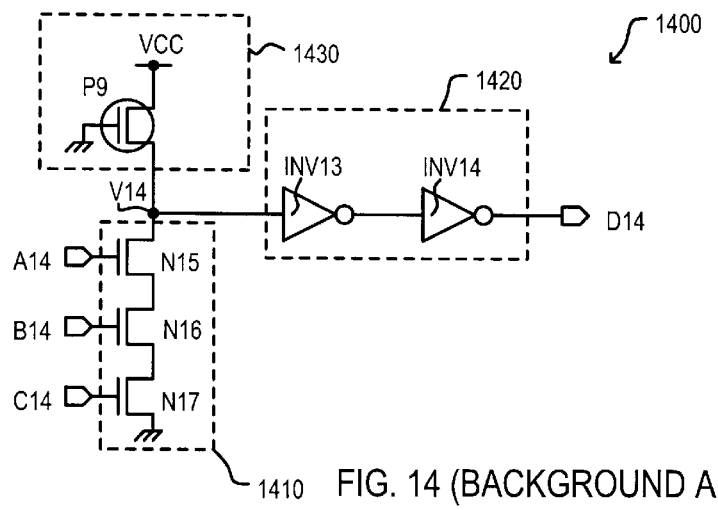
FIG. 14 is a circuit diagram of a conventional logic circuit.
Figure 15:
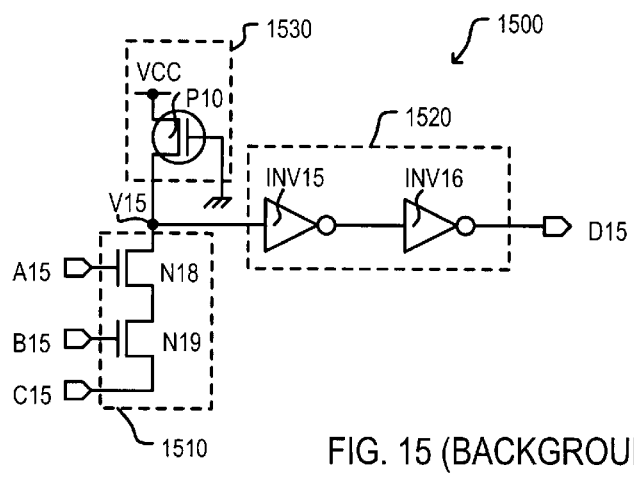
FIG. 15 is a circuit diagram of a conventional logic circuit.

In the conventional cases illustrated in FIGS. 13, 14, and 15, logic outputs (D13, D14, and D15) have rail-to-rail (VCC to GND) voltage swings. However, in the embodiment of FIG. 2, logic output D2 can have a VCC−Vt to VSS voltage swing, thus power consumption due to charging and discharging a relatively capacitive main word line D1 may be reduced. Furthermore, by timing inputs (A2, B2, and C2) so that the critical path can have a smaller input capacitance, propagation speeds can be improved.

Also, comparing logic circuit 200 in FIG. 2, to the conventional logic circuits (1400 and 1500) of FIGS. 14 and 15, it is noted that logic evaluation node V2 can switch from a logic high (unselected state) to a logic low (selected state) more rapidly than logic evaluation nodes V14 and V15. This is because p-channel MOSFETs (P9 and P10) have their gates connected to GND, thus p-channel MOSFETs (P9 and P10) are turned fully on. This can inhibit the pull down of evaluation nodes V14 and V15. However, transistor P2 can have its gate at a VCC−Vt voltage level, thus transistor P2 can be in a high impedance state and may not inhibit the pull down of logic evaluation node V2. This can improve the switching speed of logic circuit 200 as compared to conventional logic circuits (1400 and 1500).

The operating speed of logic circuit 200 can be improved by including a feedback path from logic output D2 to load circuit 230 which can actively control the impedance of transistor P2 when switching between the unselected and selected states. Because the gate capacitance of transistor P2 can be much smaller than the relatively high capacitance of a conductor and circuitry coupled to logic output D2, parasitic effects upon logic output D2 caused by transistor P2 can be negligible. Additionally, when in the non-selected state, a voltage level of VCC−Vtn can be applied to the gate of transistor P2, which can prevent logic evaluation node V2 from being in a floating condition.

When logic circuit 200 is being used as a main word decoder section 110 in FIG. 1, the operation speed can be increased by approximately 15% as compared to the conventional case.

Figure 4:
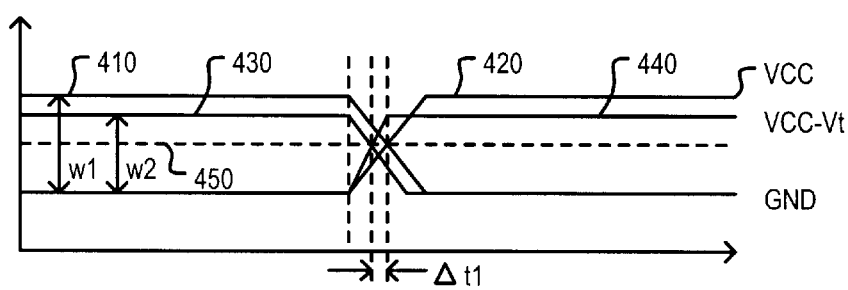
FIG. 4 is a timing diagram comparing the operation of a logic circuit according to an embodiment with a conventional logic circuit.

FIG. 4, illustrates the operational voltages and timings of a conventional logic circuit and logic circuit 200 of FIG. 2. Conventional waveform 410 illustrates a high to low transition of logic output in a conventional logic circuit. Conventional waveform 420 illustrates a low to high transition of logic output in a conventional logic circuit. Waveform 430 illustrates a high to low transition for logic output D2 in logic circuit 200. Waveform 440 illustrates a low to high transition for logic output D2 in logic circuit 200. Dashed line 450 illustrates a voltage level in which a following circuit switches from one logic level to the other logic level. It can be seen that the conventional waveforms (410 and 420) have full voltage or rail-to-rail voltage swings W1, while waveforms (430 and 430) can have reduced voltage swings W2. It can also be seen that due to having a faster driver using n-channel IGFETs (N4 and N5) for both pull-up and pull-down in driver circuit 220, logic outputs D2 illustrated as waveforms 430 and 440 can have an improved switching speed illustrated as Δt1 in FIG. 4.

Figure 3:
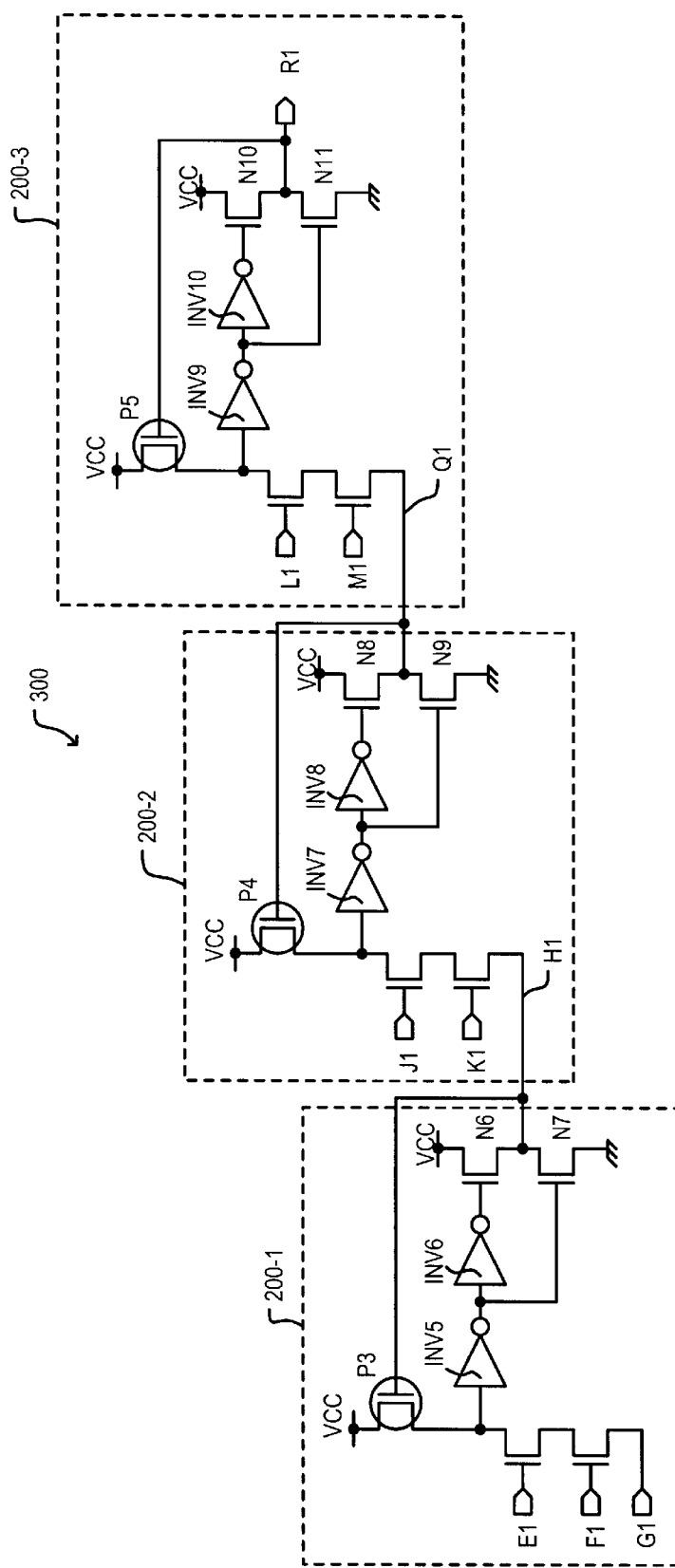
FIG. 3 is a circuit diagram of a multistage logic circuit according to an embodiment.

Referring now to FIG. 3, a circuit diagram in which logic circuit 200 is arranged in a multistage logic circuit configuration is set forth and given the general reference character 300. Multistage logic circuit 300 can include a first logic stage 200-1, a second logic stage 200-2 and a third logic stage 200-3. First logic stage 200-1 can receive first logic stage inputs (E1, F1, and G1) and produce a first stage output H1. Second logic stage 200-2 can receive second logic stage inputs (J1, K1, and H1) and can produce a second logic stage output Q1. Third logic stage 200-3 can receive third logic stage inputs (L1, M1, and Q1) and can produce a third logic stage output R1.

Of the three inputs in each logic stage, logic stage inputs (G1, H1, and Q1) can be considered to be in the critical speed path. The other logic stage inputs (<E1, F1>, <J1, K1>, and <L1, M1>) can be placed in the selected logic level at a sufficiently earlier time than the logic stage inputs (G1, H1, and Q1) in the critical speed path. Thus, a critical speed path may be selected in which signals that may have reduced capacitive load can be switching. This can reduce the operating speed of multistage logic circuit 300.

An operation for switching multistage logic circuit 300 from a non-selected state to a selected state will now be described.

The operation of each logic stage (200-1, 200-2, and 200-3) can be generally the same as the logic circuit 200 of FIG. 2.

Logic stage inputs (J1 and K1) of second logic stage 200-2 can be logic high before logic stage output H1 of first logic stage 200-1 changes from a logic high to a logic low. Second logic stage output Q1 can change from a logic high to a logic low when logic output H1 of first logic stage 200-1 changes. Logic stage inputs (L1 and M1) of third logic stage 200-3 can be logic high before logic stage output Q1 of second logic stage 200-2 changes from a logic high to a logic low. Accordingly, third logic stage output R1 can change from a logic high to a logic low when logic output Q1 of second logic stage 200-2 changes.

An operation for switching multistage logic circuit 300 from a selected state to a non-selected state will now be described.

Multistage logic circuit 300 can enter a non-selected state if any of logic stage inputs (E1 to Q1) enters a non-selected logic state. Non-selected logic states for logic stage inputs (E1, F1, J1, K1, L1, and M1) can be a logic low. Non-selected logic states for logic stage inputs (G1, H1, and Q1) can be a logic high. In this case, third logic stage output R1 can switch from a logic low to a logic high (VCC−Vt).

In multistage logic circuit 300, critical speed path (G1, H1, Q1, to R1) can operate at a lower voltage swing and lower load capacitance than conventional logic circuits. Furthermore, multistage logic circuit 300 can have a faster operating speed than conventional logic circuits due to lower voltage swing and lower load capacitance on signals in the critical speed path. This can improve the propagation delay of multistage logic circuit 300 by approximately 20%.

Figure 5:
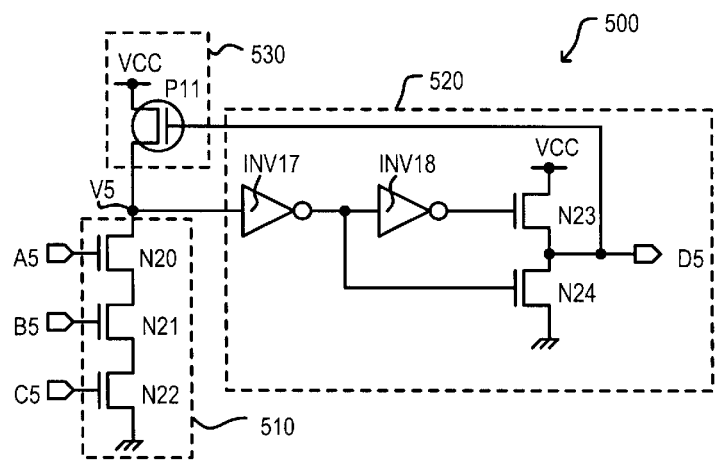
FIG. 5 is a circuit diagram of a logic circuit according to an embodiment.

Referring now to FIG. 5, a logic circuit according to an embodiment is set forth and given the general reference character 500. Logic circuit 500 may include an input circuit 510, a driver circuit 520, and a load circuit 530.

Input circuit 510 can differ from input circuit 210 in the embodiment of FIG. 2. Instead of a source drive input for the bottom logic input (C2) as in logic circuit 200, logic circuit 500 can include an input circuit with a transistor N22. Transistor N22 can have a source coupled to VSS, a drain coupled to transistor N21 and a gate coupled to receive logic input C5. Transistor N22 can be an n-channel IGFET.

In a select state, inputs (A5, B5, and C5) can have logic values of high, high and high, respectively. By using transistor N21 instead of a source drive input to receive logic input C5, an input capacitance can increase. An increased input capacitance can have adverse effects on the operation speed of logic circuit 500. However, receiving logic input C5 at a gate of transistor N21 can allow logic circuit 500 to operate effectively as a voltage converter which converts full voltage swing signals into a signal operating at reduced voltage swings.

In other aspects, input circuit 510, driver circuit 520, and load circuit 530 can operate in the same general manner as input circuit 210, driver circuit 220 and load circuit 230 in logic circuit 200 in the embodiment of FIG. 2.

Figure 6:
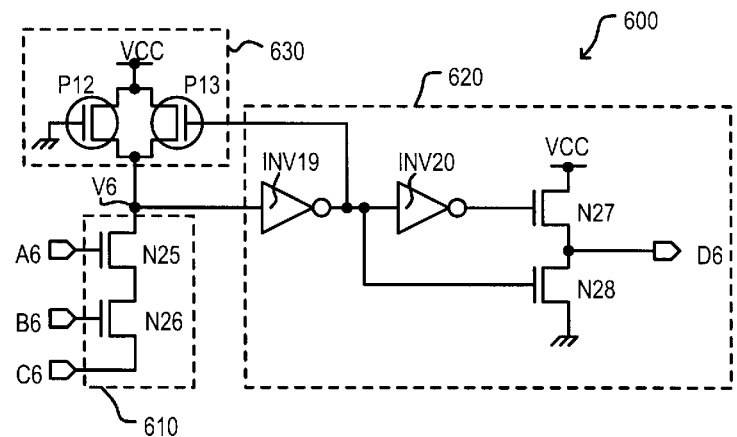
FIG. 6 is a circuit diagram of a logic circuit according to an embodiment.

Referring now to FIG. 6, a logic circuit according to an embodiment is set forth and given the general reference character 600. Logic circuit 600 may include an input circuit 610, a driver circuit 620, and a load circuit 630.

Load circuit 630 can differ from load circuit 230 in the embodiment of FIG. 2. Load circuit 630 can include a transistor P13 having a source coupled to VCC, a drain coupled to logic evaluation node V6 and a gate coupled to receive a feedback signal from driver circuit 620. The feedback signal can be driven by inverter INV19. Transistor P13 can be a p-channel IGFET. Transistor P13 can have an impedance path controllable by the feedback signal from driver circuit 620. Load circuit 630 can also include a transistor P12 having a source coupled to VCC, a drain coupled to logic evaluation node V6 and a gate coupled to receive VSS. Transistor P12 can be a p-channel IGFET that is normally turned on, thus preventing logic evaluation node V6 from floating.

In the selected state, inputs (A6, B6, and C6) can have logic values of high, high and low, respectively. When in the selected state, inverter INV19 can produce a logic high output. Because transistor P13 can receive a feedback signal, which can have a rail-to-rail voltage output, transistor P13 can be turned off when logic circuit 600 is in the select state.

In the embodiment of FIG. 6, logic output D6 can have a VCC–Vt to VSS voltage swing, thus power consumption due to charging and discharging a conductive line, coupled to logic output D6, may be reduced. Furthermore, by timing inputs (A6, B6, and C6) so that the critical path (C6) can have a smaller input capacitance, propagation speeds can be improved.

Because transistor P13 can be turned off when logic circuit 600 is in the selected state, flow through current from VCC to source driving input signal C6 can be reduced.

Figure 7:
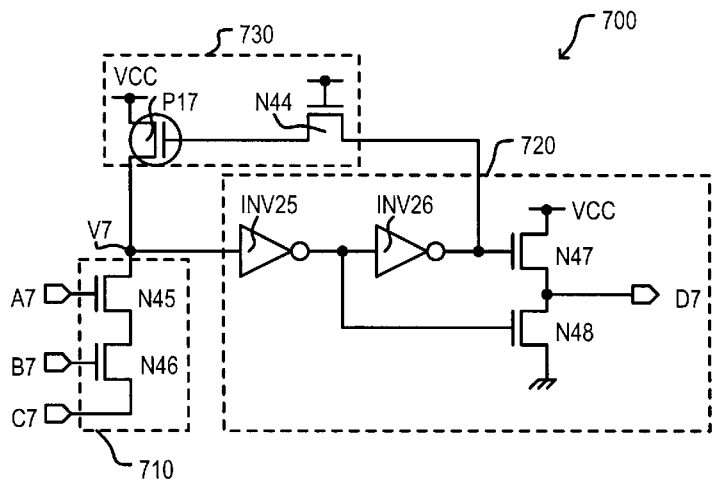
FIG. 7 is a circuit diagram of a logic circuit according to an embodiment.

Referring now to FIG. 7, a logic circuit according to an embodiment is set forth and given the general reference character 700. Logic circuit 700 may include an input circuit 710, a driver circuit 720, and a load circuit 730.

Load circuit 730 can differ from load circuit 230 in the embodiment of FIG. 2. Load circuit 730 can include transistor N44 having a source coupled to receive an output of inverter INV26, a drain coupled to a gate of transistor P17, and a gate coupled to VCC. Transistor N44 can be an n-channel IGFET. Transistor N44 can serve to allow a gate of transistor P17 to be limited to a voltage of VCC–Vt, where Vt can be the threshold voltage of transistor N44. By limiting the gate transistor P17 to a voltage of VCC–Vt, transistor P17 can remain turned on weakly, and thus can keep logic evaluation node V7 from floating. Transistor N44 can be conceptually viewed as a feedback circuit which can limit the voltage level of a gate voltage applied to transistor P17, with transistor P17 serving as a controllable active load in logic circuit 700.

The operation of logic circuit 700 can now be described. In a selected state, inputs (A7, B7, and C7) can be logical high, high, and low, respectively. In a non-selected state, one of inputs (A7, B7, or C7) can be a logical low, low, or high, respectively. Of the three inputs (A7 to C7), the source driving input (C7) to transistor N46 may be considered a critical speed path. Thus, when going from a non-selected state to a selected state input C7 can be the last input to transition into its selected condition (logic low in this case). This can improve the operating speed of logic circuit 700, because input C7 is coupled to a source of transistor N46 while the other inputs (A7 and B7) are coupled to the gates of transistors (N45 and N46), respectively. Thus, input C7 may be coupled to a smaller capacitive load than inputs A7 and B7.

Switching from the non-selected state to the selected state will now be described.

In the non-selected state, the logic level of inverter INV26 can be high and a voltage level of VCC can be output from inverter INV26. This voltage level can be fed back to the source of transistor N44 and, after a Vt drop, a voltage level of VCC–Vt may be applied to the gate of transistor P17. Thus, p-channel IGFET P17 may not be completely turned off, but can be in a high impedance state. This can allow logic evaluation node V7 to be kept at a high voltage level and may not be considered floating. In this manner a voltage level of VCC–Vt (which can be considered a logic high) can be latched at logic output D7.

As logic circuit 700 prepares for a transition from a non-selected state to a selected state, inputs (A7 and B7) can each become logic high which can turn on (makes conductive) transistors N45 and N46. A timing control circuit (not shown) can then set the timing of input C7 (the critical path), so that it can transition to a logic low. Thus, logic evaluation node V7 can be pulled down to a logic low level. Inverter INV25 can apply a logic high to the gate of transistor N48, which can turn transistor N48 on. Inverter INV26 can apply a logic low to the gate of transistor N47, which can turn transistor N47 off. With transistor N48 on and transistor N47 off, logic output D7 can be pulled down to VSS and can become a logic low level. The logic low level output of inverter INV26 can be applied as a feedback signal to the gate of transistor P17 through transistor N44, thus turning on transistor P17. Transistor P17 can be weaker than and thus over driven by transistors N45 and N46. This can allow evaluation node V7 to remain at a logic low level.

By pulling up on the logic evaluation node V7, transistor P17 can improve the speed in which logic circuit 700 transitions back to a non-selected state when inputs (A7, B7, and C7) indicate a non-selected condition. When one of the inputs (A7, B7, or C7) indicates a non-selected condition, transistor P17 can pull evaluation node V7 to a high logic level, which can cause logic output D7 to be latched at a voltage of VCC–Vt.

In the embodiment of FIG. 7, logic output D7 can have a VCC−Vt to VSS voltage swing, thus power consumption due to charging and discharging a conductive line, coupled to logic output D7, may be reduced. Furthermore, by timing inputs (A7, B7, and C7) so that the critical path (C7) can have a smaller input capacitance, propagation speeds can be improved.

It is noted that in the embodiment of FIG. 2, logic output D2 can be used to control the impedance of transistor P2. In the embodiment of FIG. 7, by using the output of inverter INV26 as a feedback signal to control the impedance of transistor P17, the load on logic output D7 can be reduced in comparison. Thus, when switching from the selected state to the non-selected state, transistor P17 may be placed in the high impedance conducting state more rapidly. This may improve the stability of logic circuit 700.

Figure 8:
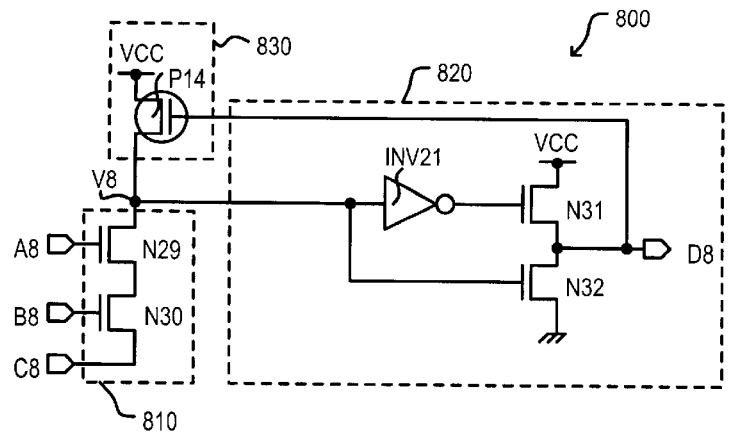
FIG. 8 is a circuit diagram of a logic circuit according to an embodiment.

Referring now to FIG. 8, a logic circuit according to an embodiment is set forth and given the general reference character 800. Logic circuit 800 may include an input circuit 810, a driver circuit 820, and a load circuit 830.

Driver circuit 820 can differ from driver circuit 220 in the embodiment of FIG. 2. Driver circuit 820 can have a logic evaluation node V8 coupled to transistor N32. Driver circuit 820 can also have an inverter INV21 having an input coupled to receive logic evaluation node V8 and an output coupled to the gate of transistor N31. Driver circuit 820 can generate a logic output D8 with the logic level of logic evaluation node V8. It is noted that the logic of logic output D8 can be the opposite of logic evaluation node V8. This is in contrast to the embodiments of FIGS. 2, 5, 6, and 7, in which driver circuits (220, 520, 620, and 720) can operate to generate logic outputs (D2, D5, D6, and D7) which can have the same logic level as logic evaluation nodes (V2, V5, V6, and V7), respectively. Therefore, the control of transistor P14 of load circuit 830 in the embodiment of FIG. 8 can be the opposite of equivalent elements in the embodiments of FIGS. 2, 5, 6, and 7.

When going from a non-selected state to a selected state, logic output D8 can transition from a logic low to a logic high (VCC−Vt) and transistor P14 can enter a high impedance state which can decrease current flowing through a current path from VCC to logic input C8 through transistors P14, N29, and N30.

Because in the selected state, logic output D8 can be a logic high, a logic circuit 800 can be used to apply gate inputs (for example, logic inputs J1 and K1 of FIG. 3) of a second stage while a differently configured logic circuit (200, 500, 600, or 700) may be used as a source drive input (for example, logic input H1 of FIG. 3) of a second stage. This can allow all input signals in a logic circuit to have a reduced voltage swing.

In the embodiment of FIG. 8, logic output D8 can have a VCC−Vt to VSS voltage swing, thus power consumption due to charging and discharging a conductive line, coupled to logic output D8, may be reduced. Furthermore, by timing inputs (A8, B8, and C8) so that the critical path (C8) can have a smaller input capacitance, propagation speeds can be improved.

Figure 9:
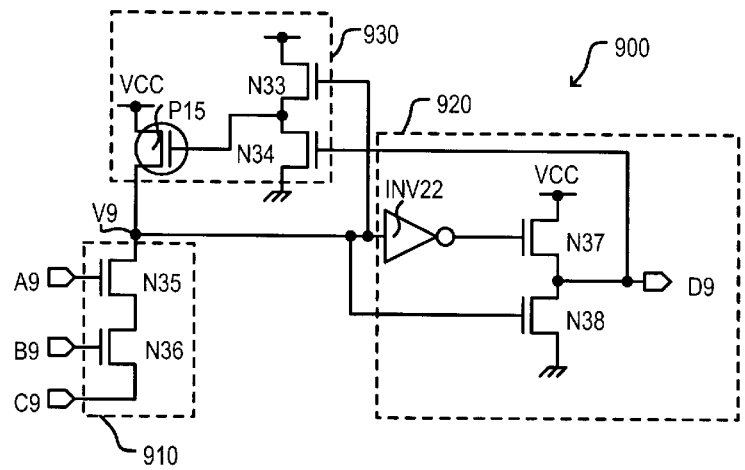
FIG. 9 is a circuit diagram of a logic circuit according to an embodiment.

Referring now to FIG. 9, a logic circuit according to an embodiment is set forth and given the general reference character 900. Logic circuit 900 may include an input circuit 910, a driver circuit 920, and a load circuit 930.

Load circuit 930 can differ from load circuit 830 in the embodiment of FIG. 8. Load circuit 930 can include transistor P15, transistor N33 and transistor N34. Transistor N33 can have a drain coupled to VCC, a source coupled to the gate of transistor P15, and a gate coupled to logic evaluation node V9. Transistor N34 can have a drain coupled to the gate of transistor P15, a source coupled to VSS, and a gate coupled to logic output D8. Transistor P15 can have a source coupled to VCC and a drain coupled to logic evaluation node V9. Transistors (N33 and N34) can be n-channel IGFETs. Transistor P15 can be a p-channel IGFET.

In a selected state, inputs (A9, B9, and C9) can be logical high, high, and low, respectively. In a non-selected state, one of inputs (A9, B9, or C9) can be a logical low, low, or high, respectively.

Switching from a non-selected state to a selected state will now be described.

In the non-selected state, logic evaluation node V9 can be at a high logic level. This high logic level can be coupled to a gate of transistor N38. The high logic level can be inverted by inverter INV22 and a low logic level can be applied to the gate of transistor N37. Thus, transistor N38 can be turned on and transistor N37 can be turned off and logic output D9 can be at a logic low level (VSS in this case). With logic output D9 at a logic low, transistor N34 can be turned off. With logic evaluation node V9 at a logic high, transistor N33 can be turned on and a voltage of VCC−Vt (where Vt is a threshold voltage of transistor N33) can be applied to the gate of transistor P15. Transistor P15 may not be completely turned off, but may be in a high impedance state. Therefore, logic evaluation node V9 may not be floating and a logic low can be considered to be latched at logic output D9.

When logic circuit 900 transitions from the non-selected state to the selected state, logic evaluation node V9 may transition from a logic high to a logic low. Transistor N33 may then be turned off. Transistor N37 and N38 may be turned on and off, respectively. Thus, logic output D9 may transition from a logic low to a logic high (VCC−Vt in this case). Transistor N34 may then be turned on and a logic low (VSS) may be applied to the gate of transistor P15. Thus, transistor P15 may be turned on to have a relatively low impedance. Transistor P15 can be weaker than and thus over driven by transistors N36 and N36, thus allowing logic evaluation node V9 to remain at a logic low level.

By pulling up on the logic evaluation node V9, transistor P15 can improve the speed in which logic circuit 900 transitions back to a non-selected state when inputs (A9, B9, and C9) indicate a non-selected condition. When one of the inputs (A9, B9, or C9) indicates a non-selected condition, transistor P15 can pull logic evaluation node V9 to a high logic level, which can cause logic output D9 to be latched at a logic low.

Because in the selected state, logic output D9 can be a logic high, a logic circuit 900 can be used to apply gate inputs (for example, logic inputs J1 and K1 of FIG. 3) of a second stage, while a differently configured logic circuit (200, 500, 600, or 700) may be used as a source drive input (for example, logic input H1 of FIG. 3) of a second stage. This can allow all input signals in a logic circuit to have a reduced voltage swing.

In the embodiment of FIG. 9, logic output D9 can have a VCC−Vt to VSS voltage swing, thus power consumption due to charging and discharging a conductive line, coupled to logic output D9, may be reduced. Furthermore, by timing inputs (A9, B9, and C9) so that the critical path (C9) can have a smaller input capacitance, propagation speeds can be improved.

When the logic circuit 900 of FIG. 9 transitions from the selected state to the non-selected state, transistor N33 may turn on before transistor N34 turns off due to the propagation delay of logic output D9 with respect to logic evaluation node V9. This can cause a current path to exist through transistors N33 and N34 for a short period of time.

Figure 10:
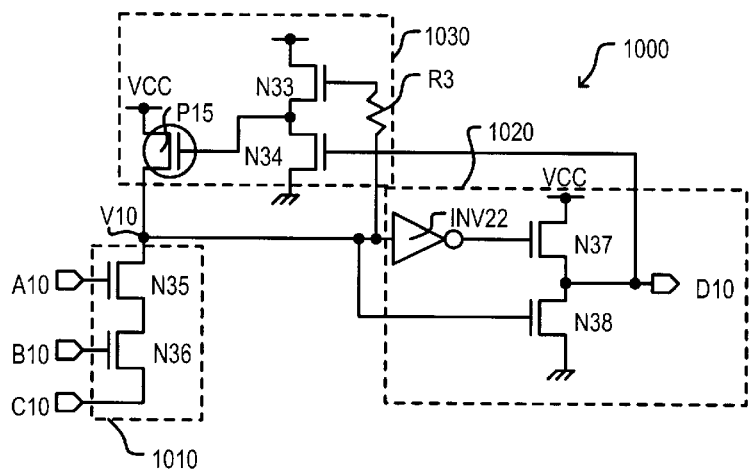
FIG. 10 is a circuit diagram of a logic circuit according to an embodiment.

Referring now to FIG. 10, a logic circuit according to an embodiment is set forth and given the general reference character 1000. Logic circuit 1000 may include an input circuit 1010, a driver circuit 1020, and a load circuit 1030.

Load circuit 1030 can differ from load circuit 930 in the embodiment of FIG. 9. Referring to FIG. 10, load circuit 1030 can include a resistor R3 coupled between logic evaluation node V10 and transistor N33. Resistor R3 can be used as a delay element to delay the turning on of transistor N33 when the logic circuit 1000 transitions from the selected state to the non-selected state. This can reduce the current path condition through transistors N33 and N34 of the embodiment of FIG. 9. Resistor R3 can be created by extending the gate poly wiring for transistor N33, as just one example. Other delay elements can be used, for example resistors in conjunction with MOS capacitors or weak buffers having increased delays, to name just a few examples.

Figure 11:
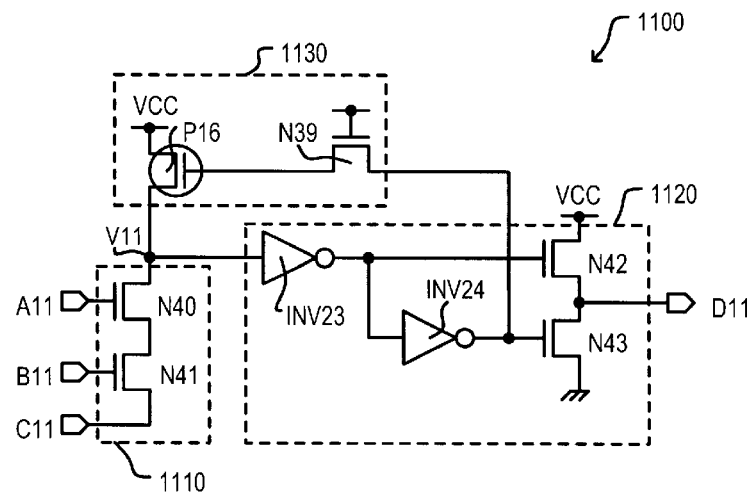
FIG. 11 is a circuit diagram of a logic circuit according to an embodiment.

Referring now to FIG. 11, a logic circuit according to an embodiment is set forth and given the general reference character 1100. Logic circuit 1100 may include an input circuit 1110, a driver circuit 1120, and a load circuit 1130.

The driver circuit 1120 can differ from driver circuit 720 in the embodiment of FIG. 7. Driver circuit 1120 can include inverters (INV23 and INV24) and transistors (N42 and N43). Inverter INV23 can receive logic evaluation node V11 as an input and can produce an output coupled to the gate of transistor N42. Inverter NV24 can have an input coupled to the output of inverter INV23 and may produce an output coupled to the gate of transistor N43 and go load circuit 1130. Transistor N42 can have a drain coupled to VCC and a source coupled to logic output D11. Transistor N43 can have a drain coupled to logic output D11 and a source coupled to VSS.

In a selected state, inputs (A11, B11, and C11) can be logical high, high, and low, respectively. In a non-selected state, one of inputs (A11, B11, or C11) can be a logical low, low, or high, respectively.

Switching from the non-selected state to the selected state will now be described.

In the non-selected state, the logic level of inverter INV24 can be high and a voltage level of VCC can be output from inverter INV24. This voltage level can be fed back to the source of transistor N39 and, after a Vt drop, a voltage level of VCC−Vt may be applied to the gate of transistor P16. Thus, p-channel IGFET P16 may not be completely turned off, but can be in a high impedance state. This can allow logic evaluation node V11 to be kept at a high voltage level and may not be considered floating. In this manner a voltage level of VSS (which can be considered a logic low) can be latched at logic output D11.

As logic circuit 1100 prepares for a transition from a non-selected state to a selected state, inputs (A11 and B11) can each become logic high which can turn on (make conductive) transistors N40 and N41. A timing control circuit (not shown) can then set the timing of input C11 (the critical path), so that it can transition to a logic low. Thus, logic evaluation node V11 can be pulled down to a logic low level. Inverter INV23 can apply a logic high to the gate of transistor N42, which can turn transistor N42 on. Inverter INV24 can apply a logic low to the gate of transistor N43 which can turn transistor N43 off. With transistor N42 on and transistor N43 off, logic output D11 can be pulled up to VCC−Vt and can become a logic high level. The logic low level output of inverter INV24 can be applied as a feedback signal to the gate of transistor P16 through transistor N39, thus turning on transistor P16. Transistor P16 can be weaker than, and thus over driven by, transistors N40 and N41. This can allow evaluation node V11 to remain at a logic low level.

By pulling up on the logic evaluation node V11, transistor P16 can improve the speed in which logic circuit 1100 transitions back to a non-selected state when inputs (A11, B11, and C11) indicate a non-selected condition. When one of the inputs (A11, B11, or C11) indicate a non-selected condition, transistor P16 can pull evaluation node V11 to a high logic level, which can cause logic output D11 to be latched at a voltage of VSS or a logic low.

In the embodiment of FIG. 11, logic output D11 can have a VCC−Vt to VSS voltage swing, thus power consumption due to charging and discharging a conductive line, coupled to logic output D11, may be reduced. Furthermore, by timing inputs (A11, B11, and C11) so that the critical path (C11) can have a smaller input capacitance, propagation speeds can be improved.

It is noted that in the embodiment of FIG. 2, logic output D2 can be used to control the impedance of transistor P11. In the embodiment of FIG. 11, by using the output of inverter INV24 as a feedback signal to control the impedance of transistor P16, the load on logic output D11 can be reduced in comparison. Thus, when switching from the selected state to the non-selected state, transistor P11 may be placed in the high impedance conducting state more rapidly. This may improve the stability of logic circuit 1100.

Because in the selected state, logic output D11 can be a logic high, a logic circuit 1100 can be used to apply gate inputs (for example, logic inputs J1 and K1 of FIG. 3) of a second stage, while a differently configured logic circuit (200, 500, 600, or 700) may be used as a source drive input (for example, logic input H1 of FIG. 3) of a second stage. This can allow all input signals in a logic circuit to have a reduced voltage swing.

Figure 12:
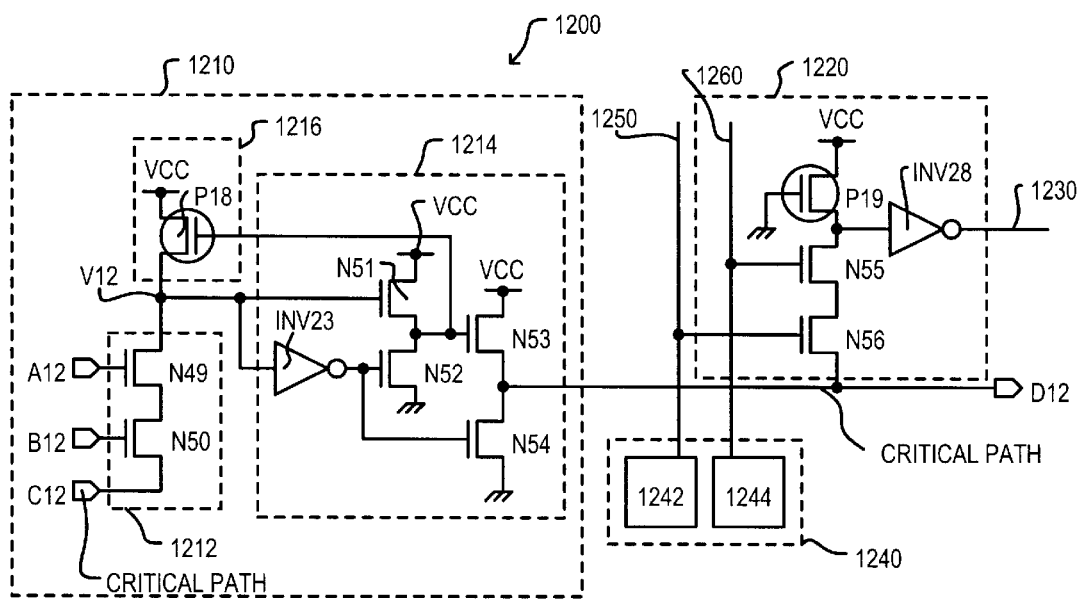
FIG. 12 is a circuit diagram of a decoder circuit according to an embodiment.

Referring now to FIG. 12, a decoder circuit is set forth and given the general reference character 1200. Decoder circuit 1200 can be used to illustrate an application for logic circuits (800, 900, 1000, or 1100) in a word line decoding scheme of a semiconductor memory device. Decoder circuit 1200 can include a main word decoder section 1210, a subword decoder section 1220, and a main block decoder section 1240. Main word decoder section 1210 can receive word addresses or factors (pre-decoded addresses) A12, B12, and C12 and can generate a main word line D12. Main word line D12 can be received by subword decoder section 1220. Main block decoder section 1240 can receive addresses (not shown) and produce block decode lines (1250 and 1260). Block decode lines (1250 and 1260) can be received by sub-word decoder section 1220. Sub-word decoder section 1220 can generate a sub-word line 1230.

Main block decoder section 1240 can include logic circuits (1242 and 1244). Logic circuits (1242 and 1244) can be of the same type as logic circuit (800, 900, 1000, or 1100) in FIGS. 8, 9, 10, or 11, respectively.

Main word decoder section 1210 can include an input circuit 1212, driver circuit 1214, and a load circuit 1216. Main word decoder section 1210 can be similar to decoder circuit 200 of FIG. 2. However, driver circuit 1214 can differ from driver circuit 220 in the embodiment of FIG. 2. Driver circuit 1214 can include transistors (N51 and N52). Transistors (N51 and N52) can be configured to operate as an inverter and can have an inverter output operating as a feedback signal to load circuit 1216. Transistors (N51 and N52) can also be n-channel IGFETs.

In a selected state of main word decoder section 1210, inputs (A12, B12, and C12) can be logical high, high, and low, respectively. In a non-selected state, one of inputs (A12, B12, or C12) can be a logical low, low, or high, respectively.

Switching from the non-selected state to the selected state will now be described.

In the non-selected state, logic evaluation node V12 can be at a high voltage level, transistor N51 can be turned on and transistor N52 can be turned off. Transistor N51 can output a voltage level of VCC−Vt (Vt is a threshold voltage of n-channel IGFET N51). This voltage level can be fed back to the gate of transistor P18. Thus, p-channel IGFET P18 may not be completely turned off, but can be in a high impedance state. This can allow logic evaluation node V12 to be kept at a high voltage level and may not be considered floating. Thus, the logic high level can propagate through inverter INV27 to produce a logic low output which can keep transistor N54 in a non-conducting or off state. With transistor N53 producing a voltage level of VCC−Vt at the gate of transistor N53, main word line D12 can be at a voltage level of VCC−2Vt (which can be considered a logic high), where Vt is a threshold voltage of n-channel IGFETs (N51 and N53).

As main word decoder section 1210 prepares for a transition from a non-selected state to a selected state, inputs (A12 and B12) can each become logic high which can turn on (makes conductive) transistors N49 and N50. A timing control circuit (not shown) can then set the timing of input C12 (the critical path), so that it can transition to a logic low. Thus, logic evaluation node V12 can be pulled down to a logic low level. Inverter INV23 can apply a logic high to the gate of transistor N54, which can turn transistor N54 on. Transistor N52 can apply a logic low to the gate of transistor N53 which can turn transistor N53 off. With transistor N54 on and transistor N53 off, main word line D12 can be pulled down to VSS and can become a logic low level.

With transistor N52 on and transistor N53 off, a logic low level can be applied as a feedback signal to the gate of transistor P18, thus turning on transistor P18. Transistor P18 can be weaker than, and thus over driven by, transistors N49 and N50. This can allow evaluation node V12 to remain at a logic low level.

By pulling up on the logic evaluation node V12, transistor P18 can improve the speed in which main word decoder section 1210 transitions back to a non-selected state when inputs (A12, B12, and C12) indicate a non-selected condition. When one of the inputs (A12, B12, or C12) indicate a non-selected condition, transistor P18 can pull evaluation node V12 to a high logic level, which can cause main word line D12 to be latched at a voltage of VCC−2Vt.

Block decode lines (1250 and 1260) can have a reduced voltage swing of VCC−Vt to VSS. When block decode lines (1250 and 1260) have a voltage level of VCC−Vt, transistors (N55 and N56) can be enabled or turned on. When block decode lines (1250 and 1260) have a voltage level of VSS, transistors (N55 and N56) can be disabled or turned off. A critical speed path can be designated as input C12 and main word line D12. Thus, inputs (A12 and B12) as well as block decode lines (1250 and 1260) can be placed in an enable condition at an earlier time than input C12 and main word line D12.

Relatively highly capacitive main word line D12 can have a reduced voltage swing of VCC−2Vt to VSS. Block decode lines (1250 and 1260) can have a reduced voltage swing of VCC−Vt to VSS. These reduced voltage swings can reduce power consumption and can improve operating speeds of decode circuitry in a memory device.

The signal applied to control gates of load transistors (P2, P3, P4, P5, P11, P13, P14, P15, P17, and P18) of the embodiments can be conceptualized as a load control signal.

It is understood that the embodiments described above are exemplary and the present invention should not be limited to those embodiments. For example, the embodiments have been described in which drive circuits have included two n-channel IGFETs that can generate a logic output and the logic output can be fed back into a p-channel IGFET load. A logic circuit may also have a drive circuit including two p-channel IGFETs that can generate a logic output, and the logic output can be fed back into an n-channel IGFET load, as just one example. In this case, a source driving critical path can be coupled to a p-channel IGFET in an input circuit. Transistor conductivity types and power supplies may be reversed. However, this can have adverse effects on operation speeds of the logic circuit.

Although logic circuits such as disclosed in the embodiments have been discussed with respect to address decoding in a semiconductor memory, logic circuits may be used in multistage combinatorial logic in which output voltage swings and/or load capacitance improvements may be desirable.

Embodiments have been described in which a basic logic circuit may include an input circuit with vertically stacked transistors of one conductivity type. A critical timing path can include an input signal coupled to a source region of the vertically stacked transistors. An input circuit can be coupled to a load circuit at a logic evaluation node. An output circuit can receive the logic evaluation node and produce a logic output having a reduced voltage swing. The load circuit can receive a feedback signal from the output circuit and can actively control an impedance of the load circuit.

The basic logic circuit can be used in a multistage logic circuit in which the first logic circuit can have an output coupled to a source drive input of the following logic circuit. This may result in a multistage logic circuit that can have signals with reduced voltage swings and/or decreased capacitive loads.

A decoder configuration in which gate inputs can have a reduced voltage swing (for example VCC−Vt) and a source drive input can have a further reduced voltage swing (for example VCC−2Vt) has been described. This can further increase circuit operating speeds and can reduce power consumption.

Logic circuits in which inputs can have a rail-to-rail voltage swing and outputs can have a reduced voltage swing have been described. An actively controlled load can improve logic circuit operating speeds.

A logic circuit that can have a reduced current consumption through an input circuit has been disclosed. An actively controlled load can decrease a flow through current when a logic circuit is in a selected state.

In a logic circuit according to embodiments disclosed, a load circuit can be normally on to prevent a logic evaluation node from floating. A load circuit can have a high impedance on state and a low impedance on state.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A logic circuit, comprising:

a first power supply having a first power supply voltage;

a second power supply having a second power supply voltage;

an input circuit including a first input insulated gate field effect transistor (IGFET) of a first conductivity type having a drain coupled to a logic evaluation node and a gate coupled to receive a first input signal;

a load circuit including a first load IGFET of a second conductivity type having a source coupled to the first power supply, a drain coupled to the logic evaluation node and a gate coupled to receive a load control signal; and an output circuit coupled to receive the logic evaluation node and produce a logic output having a voltage swing of less than a rail-to-rail swing with respect to the first and second power supplies.

2. The logic circuit of claim 1, wherein the load control signal is the logic output.

3. The logic circuit of claim 2, wherein the input IGFET includes a source coupled to receive a second input signal.

4. The logic circuit of claim 3, wherein:

the output circuit includes a first driver IGFET of the first conductivity type having a drain coupled to the first power supply, a source coupled to the logic output and a gate coupled to the logic evaluation node, a second driver IGFET of the first conductivity type having a drain coupled to the logic output, a source coupled to the second power supply, and a gate coupled to the logic evaluation node.

5. The logic circuit of claim 4, wherein:

the output circuit further includes a first inverter having an input coupled to the logic evaluation node and an output coupled to gate of the first driver IGFET.

6. The logic circuit of claim 5, wherein:

the input circuit further includes a second input IGFET of the first conductivity type having a source coupled to the drain of the first input IGFET, a drain coupled to the logic evaluation node, and a gate coupled to a third input signal.

7. The logic circuit of claim 1, wherein:

the load circuit further includes a second load IGFET of the second conductivity type having a source coupled to the first power supply, a drain coupled to the logic evaluation node, and a gate coupled to the first power supply.

8. The logic circuit of claim 1, wherein the load circuit includes a voltage limiting IGFET that limits the voltage swing of the load control signal to a voltage swing of less than the rail-to-rail swing with respect to the first and second power supplies.

9. The logic circuit of claim 1, wherein the first input IGFET of the first conductivity type is an n-channel IGFET, the first load IGFET of the second conductivity type is a p-channel IGFET.

10. A logic circuit comprising:

a first power supply having a first power supply voltage;

a second power supply having a second power supply voltage;

an input circuit including a first input insulated gate field effect transistor (IGFET) of a first conductivity type having a drain coupled to a logic evaluation node and a gate coupled to receive a first input signal;

a load circuit including a first load IGFET of a second conductivity type having a source coupled to the first power supply, a drain coupled to the logic evaluation node and a gate coupled to receive a load control signal having a voltage swing of less than a rail-to-rail swing with respect to the first and second power supplies; and an output circuit coupled to receive the logic evaluation node and produce a logic output having a voltage swing of less than the rail-to-rail swing with respect to the first and second power supplies.

11. The logic circuit of claim 10, wherein the output circuit further includes:

a first driver IGFET of the first conductivity type having a drain coupled to the first power supply, a source coupled to the logic output and a gate coupled to the logic evaluation node; and a second driver IGFET of the first conductivity type having a drain coupled to the logic output, a source coupled to the second power supply, and a gate coupled to the logic evaluation node.

12. The logic circuit of claim 11, wherein:

the output signal is the load control signal.

13. The logic circuit of claim 11, wherein the load circuit further includes:

a voltage limiting IGFET of the first conductivity type that limits the voltage swing of the load control signal.

14. The logic circuit of claim 13, wherein the load circuit further includes:

a delay device coupled between the gate of the voltage limiting IGFET and the logic evaluation node.

15. The logic circuit of claim 11, wherein the driver circuit further includes:

a driver voltage control IGFET of the first conductivity type having a drain coupled to the first power supply voltage, a source coupled to the gate of the first driver IGFET, and a gate coupled to the logic evaluation node; and the voltage swing of the gate of the first driver IGFET is less than a rail-to-rail voltage swing with respect to the first and second power supplies.

16. A multi-stage logic circuit comprising:

a first power supply having a first power supply voltage;

a second power supply having a second power supply voltage;

a first logic circuit coupled to the first and second power supplies, the first logic circuit having a plurality of first logic inputs and a first logic output having a voltage swing of less than a rail-to-rail swing with respect to the first and second power supplies, wherein at least one of the first logic inputs includes a first logic source drive input coupled to receive a first logic source drive signal;

a second logic circuit coupled to the first and second power supplies, the second logic circuit having a plurality of second logic inputs and a second logic output having a voltage swing of less than the rail-to-rail swing with respect to the first and second power supplies, wherein the plurality of second logic inputs includes a second logic source drive input; and the first logic output is coupled to the second logic source drive input.

17. The multi-stage logic circuit of claim 16, wherein the multi-stage logic circuit is a decoder circuit for semiconductor memory and the multi-stage logic circuit further includes:

the second logic circuit coupled to receive the first logic output at the second logic source drive input and coupled to receive at least one other second logic input at a second logic gate input.

18. The multi-stage logic circuit of claim 17, further including:
   a third logic circuit coupled to the first and second power supplies, the third logic circuit generating the second logic gate input having a voltage swing of less than the rail-to-rail swing with respect to the first and second power supplies, wherein the second logic gate input has a voltage swing of greater than the voltage swing of the first logic output.

19. The multi-stage logic circuit of claim 16, wherein plurality of first logic inputs are derived from address signals in a semiconductor memory device.

20. The multi-stage logic circuit of claim 16, further including:
   a third logic circuit coupled to the first and second power supplies, the third logic circuit having a plurality of third logic inputs and a third logic output having a voltage swing of less than the rail-to-rail swing with respect to the first and second power supplies, wherein the plurality of third logic inputs includes a third logic source drive input; and
   the second logic output is coupled to the third logic source drive input.

* * * * *